(12) United States Patent
Christensen et al.

(10) Patent No.: US 10,886,004 B2
(45) Date of Patent: *Jan. 5, 2021

(54) SORTING NON-VOLATILE MEMORIES

(71) Applicant: International Business Machines Corporation, Armonk, NY (US)

(72) Inventors: Jeffrey W. Christensen, Katy, TX (US); Phillip E. Christensen, Houston, TX (US); Daniel E. Moore, Wake Forest, NC (US); Antoine G. Sater, Houston, TX (US); Jung H. Yoon, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/520,836

(22) Filed: Jul. 24, 2019

(65) Prior Publication Data
US 2019/0348144 A1 Nov. 14, 2019

Related U.S. Application Data

(63) Continuation of application No. 15/008,843, filed on Jan. 28, 2016, now Pat. No. 10,460,825.

(51) Int. Cl.
*G11C 29/56* (2006.01)
*G11C 29/34* (2006.01)
(Continued)

(52) U.S. Cl.
CPC ........ *G11C 29/56008* (2013.01); *G11C 16/04* (2013.01); *G11C 29/38* (2013.01);
(Continued)

(58) Field of Classification Search
CPC .. G11C 29/56008; G11C 16/349; G11C 29/44
See application file for complete search history.

(56) References Cited

U.S. PATENT DOCUMENTS

| | | | |
|---|---|---|---|
| 5,298,433 A | 3/1994 | Furuyama | |
| 5,489,538 A * | 2/1996 | Rostoker | G01R 31/2863 438/15 |

(Continued)

FOREIGN PATENT DOCUMENTS

WO 2013048451 A1 4/2013

OTHER PUBLICATIONS

List of IBM Patents or Patent Applications Treated as Related, Filed Jul. 24, 2019, 2 pages.

(Continued)

*Primary Examiner* — Joseph D Torres
(74) *Attorney, Agent, or Firm* — David B. Woycechowsky

(57) ABSTRACT

A computer-implemented method for sorting non-volatile random access memories (NVRAMS) includes testing a failure metric for each of a plurality of NVRAMS over a plurality of testing sessions to capture failure metric data that corresponds to the plurality of NVRAMS. The method also includes determining a trend in the failure metric as a function of testing cycles for each of the plurality of NVRAMS from the failure metric data, and separating the plurality of NVRAMS into groups based on the trend in the failure metric as a function of testing cycles. A corresponding computer program product and computer system are also disclosed herein.

9 Claims, 4 Drawing Sheets

(51) Int. Cl.
    *G11C 29/44*     (2006.01)
    *G11C 29/50*     (2006.01)
    *G11C 29/38*     (2006.01)
    *G11C 16/04*     (2006.01)
    *G11C 16/34*     (2006.01)
(52) U.S. Cl.
    CPC .............. *G11C 29/44* (2013.01); *G11C 29/50* (2013.01); *G11C 29/50004* (2013.01); *G11C 16/349* (2013.01)

(56) References Cited

U.S. PATENT DOCUMENTS

| | | | | |
|---|---|---|---|---|
| 5,726,920 | A * | 3/1998 | Chen | G01R 31/2831 324/73.1 |
| 5,751,633 | A | 5/1998 | Hsia | |
| 6,075,724 | A | 6/2000 | Li | |
| 6,496,788 | B1 * | 12/2002 | Kikuchi | G06F 17/10 438/14 |
| 6,732,062 | B2 * | 5/2004 | Hong | H01L 22/20 257/E21.525 |
| 7,220,605 | B1 * | 5/2007 | Cadouri | H01L 22/20 257/E21.521 |
| 7,319,935 | B2 * | 1/2008 | Sun | G01R 31/318511 356/237.4 |
| 7,350,105 | B2 | 3/2008 | Aasheim | |
| 7,453,261 | B1 * | 11/2008 | Mark | G01R 31/2894 324/754.03 |
| 7,570,796 | B2 | 8/2009 | Zafar | |
| 8,447,918 | B2 | 5/2013 | Sprinkle | |
| 8,910,020 | B2 | 12/2014 | Frayer | |
| 9,047,214 | B1 | 6/2015 | Northcott | |
| 9,530,522 | B1 * | 12/2016 | Christensen | G11C 29/38 |
| 2006/0241802 | A1 | 10/2006 | Chen | |
| 2007/0282544 | A1 * | 12/2007 | Zhang | G05B 19/41875 702/55 |
| 2007/0288185 | A1 | 12/2007 | Burch | |
| 2008/0007284 | A1 | 1/2008 | Balog | |
| 2008/0147355 | A1 | 6/2008 | Fields | |
| 2009/0117673 | A1 | 5/2009 | Matsushita | |
| 2010/0088560 | A1 * | 4/2010 | Chakravarthy | G01R 31/31718 714/724 |
| 2010/0122148 | A1 * | 5/2010 | Flynn | G06F 11/108 714/773 |
| 2012/0239347 | A1 * | 9/2012 | Nitta | G11C 29/56008 702/181 |
| 2013/0173972 | A1 | 7/2013 | Kubo | |
| 2014/0185264 | A1 * | 7/2014 | Chen | H01L 25/0652 361/814 |
| 2014/0237298 | A1 | 8/2014 | Pe'er | |
| 2015/0177995 | A1 | 6/2015 | Camp | |
| 2016/0034206 | A1 | 2/2016 | Ryan | |
| 2016/0041873 | A1 | 2/2016 | Davis | |
| 2017/0221582 | A1 | 8/2017 | Christensen | |
| 2017/0221586 | A1 | 8/2017 | Christensen | |
| 2017/0221587 | A1 | 8/2017 | Christensen | |

OTHER PUBLICATIONS

"Bad Block Management in NAND Flash Memory", Micron, TN-29-59: Bad Block Management in NAND Flash Memory Introduction, Micron Technology, Inc., tn2959_bbm_in_nand_flash.fm—Rev. H 4/11 EN 1 © 2011 Micron Technology, 4 pages.

Disclosed Anonymously et al., "Method for Code Transparency with Enhanced JTAG Secure Mode in Systems with External Flash", An IP.com Prior Art Database Technical Disclosure, IP.com No. 000227845, IP.com Electronic Publication: May 21, 2013, 5 pages.

Odeh et al., "NAND Flash Architectures Reducing Write Amplification Through Multi-Write Codes", 978-1-4799-5671-5/14, © 2014 IEEE, 10 pages.

* cited by examiner

SORTING NON-VOLATILE MEMORIES

BACKGROUND OF THE INVENTION

The present invention relates generally to manufacturing quality and more particularly to manufacturing quality for electronic non-volatile random access memory devices such as flash memory chips, cards, and modules.

Non-volatile random access memories (NVRAMS) such as flash memories are subject to manufacturing defects as well as limited erase/program/read cycles. Detecting whether NVRAMS will fail early during their lifetime at the time of manufacture is a challenge and results in increased manufacturing costs and the unnecessary rejection of many usable devices.

SUMMARY

According to an aspect of the present invention, there is a method, computer program product and/or system that performs the following operations (not necessarily in the following order): (i) testing a failure metric for each of a plurality of NVRAMS over a plurality of testing sessions to capture failure metric data that corresponds to the plurality of NVRAMS; (ii) determining a trend in the failure metric as a function of testing cycles for each of the plurality of NVRAMS from the failure metric data; (iii) physically separating the plurality of NVRAMS into routing groups based on the trend in the failure metric as a function of testing cycles; and (iv) physically routing, via the one or more processors, the routing groups within a manufacturing environment.

DETAILED DESCRIPTION

The embodiments disclosed herein recognize that the cost of exhaustive testing on NVRAMS is prohibitive and may contribute to device wear. The embodiments disclosed herein also recognize that the ability to predict future device failures may reduce the required testing burden at the time of manufacture. Furthermore, the frequency and costs associated with unnecessary rejections and post-manufacturing failures may also be reduced.

It should be noted that references throughout this specification to features, advantages, or similar language herein do not imply that all of the features and advantages that may be realized with the embodiments disclosed herein should be, or are in, any single embodiment of the invention. Rather, language referring to the features and advantages is understood to mean that a specific feature, advantage, or characteristic described in connection with an embodiment is included in at least one embodiment of the present invention. Thus, discussion of the features, advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention may be practiced without one or more of the specific features or advantages of a particular embodiment. In other instances, additional features and advantages may be recognized in certain embodiments that may not be present in all embodiments of the invention.

These features and advantages will become more fully apparent from the following drawings, description and appended claims, or may be learned by the practice of the invention as set forth hereinafter.

Figure 1:
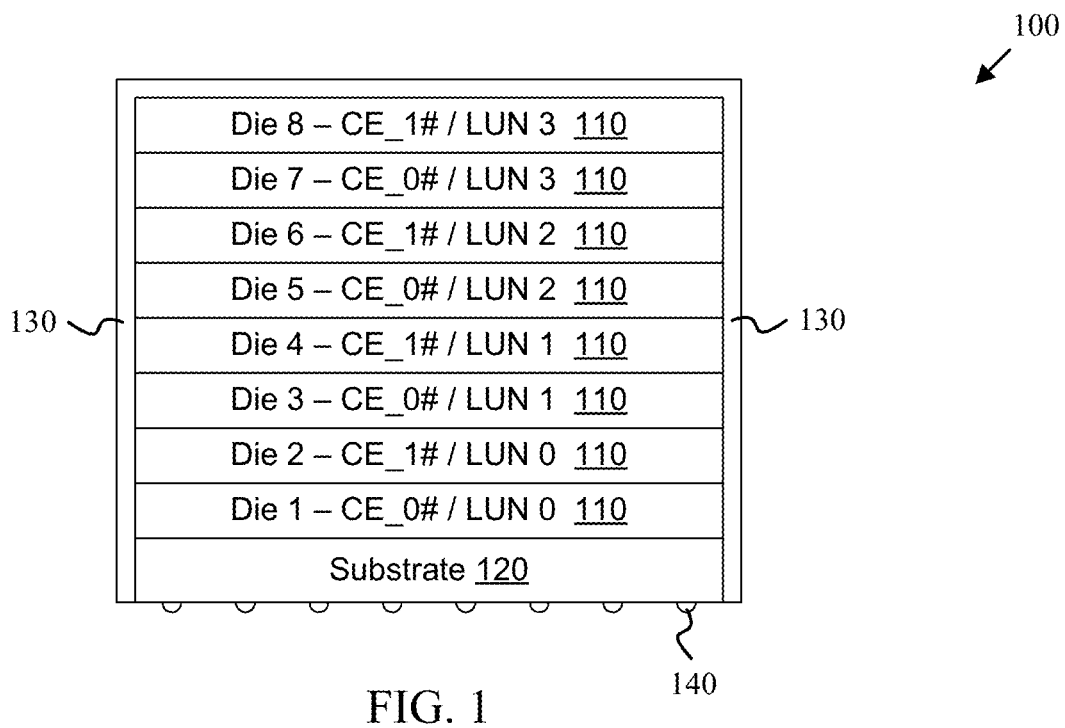
FIG. 1 is a schematic block diagram depicting one example of an NVRAM package in accordance with at least one embodiment of the present invention.

FIG. 1 is a schematic block diagram depicting one example of an NVRAM package 100 in accordance with at least one embodiment of the present invention. As depicted, the NVRAM package 100 includes a number of die 110 that are stacked and interconnected with each other and with a substrate 120. The depicted NVRAM package 100 also includes an encapsulant 130 that encapsulates and protects the NVRAM package 100. The depicted NVRAM package 100 also includes one or more interconnection elements 140 that enable mounting the NVRAM package 100 on a circuit board and interconnecting with other NVRAM packages 100 as well as other circuits.

The NVRAM package 100 and other forms of NVRAM may be subject to memory wear degradations within the individual memory cells on the die 110 in addition to packaging faults due to manufacturing issues. While many of the faults and some of the degradations may be easily detected with testing at the time of manufacture, others may not become unacceptable for a considerable length of time. Furthermore, some degradation or wear is expected and can be tolerated as long as the package can perform well over an expected lifetime after which the NVRAM packages 100, or the components or systems into which they are integrated, can be replaced as a whole.

The embodiments disclosed herein recognize that detecting degradation within individual NVRAM components within a computer storage system and replacing those components increases the maintenance costs associated with computer storage. The embodiments disclosed herein also recognize that the ability to predict, at the time of manufacture, NVRAM components that are at high risk of failure in the field can substantially reduce those maintenance costs. The embodiments disclosed herein also recognize that detecting failure metric patterns or trends may improve the ability to assess which NVRAM components are at high risk of failure in the field and/or reduce the number of testing cycles needed to achieve a sufficiently high level of confidence for the assessment.

Figure 2:
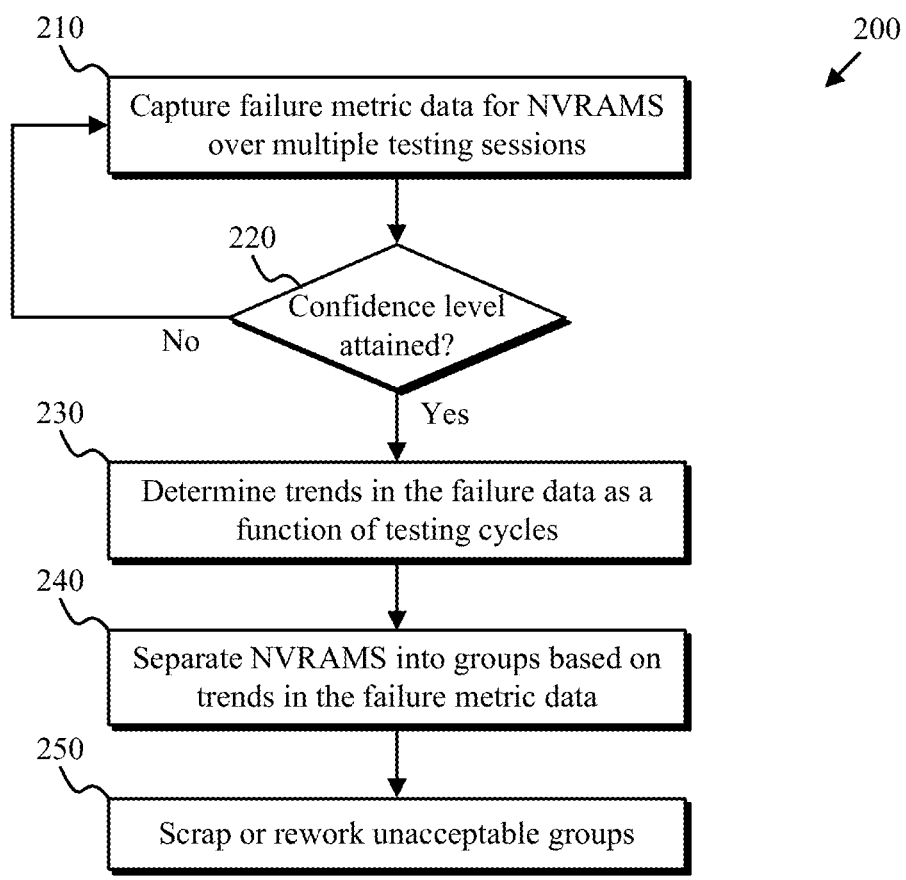
FIG. 2 is a flowchart depicting one example of a NVRAM sorting method in accordance with at least one embodiment of the present invention.

FIG. 2 is a flowchart depicting one example of a NVRAM sorting method 200 in accordance with at least one embodiment of the present invention. As depicted, the NVRAM sorting method 200 includes capturing (210) failure metric data, determining (220) whether a selected confidence level has been attained, determining (230) trends in the failure metric data, separating (240) NVRAMS into groups, and scrapping or reworking (250) unacceptable groups. The NVRAM sorting method 200 enables the detection of NVRAM components at the time of manufacture that have a high risk of failure in the field.

Capturing (210) failure metric data may include testing a failure metric for each member of a set of NVRAMS over multiple testing sessions and thereby capture failure metric data that corresponds to the set of NVRAMS. Examples of the failure metric include grown bad blocks, total bad blocks, a bit error rate, and an error count. The multiple testing sessions may occur at the time of manufacture of the NVRAMS or the components or systems into which they are integrated.

Determining (220) whether a selected confidence level has been attained may include determining whether enough data has been captured to achieve the selected confidence level. For example, determining (220) may assess whether the number of testing sessions and the quantity of failure metric data that has been collected is sufficient to determine the risk of field failures.

In some embodiments, statistical analysis is used to determine how many testing sessions are required to determine the risk of failure in the field of the NVRAMS. For example, one or more separation metrics may be derived from the failure metric data that enable separating the NVRAMS into groups. Statistical analysis may be used to determine the confidence level of the separation metrics for the collected failure metric data. In certain embodiments, the statistical analysis is dynamic and is updated with each testing session and may be dependent on the particular failure metric pattern(s) for a specific NVRAM or NVRAM group. Consequently, the number of test cycles may be open ended until the selected confidence level is achieved for each NVRAM or NVRAM group.

Determining (230) trends in the failure data may include determining an expected future value for the failure metric, or one or more parameters correlated thereto such as derivatives of the failure metric as a function of usage. For example, curve fitting may be conducted on the failure metric data as a function of usage so that an estimate of the failure metric may be generated without conducting additional testing sessions.

Separating (240) the NVRAMS into groups based may include determining whether a trend in the failure metric for a particular NVRAM deviates significantly from typical trends in the failure metric for the NVRAMS. Separating (240) NVRAMS into groups may also include clustering failure metric patterns using techniques known to those of skill in the art of statistical analysis or the like. For example, N failure metric values for each NVRAM may be used to form data elements in a multi-dimensional space (e.g., vectors of N dimensions) and Euclidean distances or inner products may be used to determine groupings. Other examples include hierarchical clustering, k-means clustering and expectation maximization. In some embodiments, the failure metric data is weighted according to the testing session. For example, more recent testing session may be weighted higher than initial testing sessions. Separating (240) NVRAMS into groups may also include physically separating the NVRAMS according to the clustered groups. The separated groups may also be labeled (either automatically or via human assistance) to facilitate routing of the groups to the next appropriate phase of manufacturing or distribution. Examples of groups include a scrap group, a rework group, an acceptable quality group, and an exceptional quality group.

In some embodiments, an average, median, or centroid of the group is compared with various thresholds or multidimensional space limits to determine how the clustered group should be routed. In such an embodiment, some NVRAMS within a clustered group may be labeled and routed differently than if they were individually labeled and routed. The thresholds or limits used to separate the NVRAMS into groups may be dynamically adjusting as additional testing sessions are conducted.

In some embodiments, a separation metric is derived from the failure metric data that enables separation into groups. For example, the centroids of two cluster groups could be used to calculate a separation metric that corresponds to a line that connects the centroids. The distributions of the separation metrics for the two groups can then be used to determine one or more thresholds that can be used to sort the NVRAMS into the two groups. The separation metrics and thresholds may also be applied to NVRAMS that are subsequently tested.

Scrapping or reworking (250) unacceptable groups may include routing the NVRAMS corresponding to unacceptable cluster groups to scrapping or reworking stations within a manufacturing environment. In some embodiments, the failure metric data is analyzed to determine faulty device locations for NVRAMS within a reworking group. The identified faulty device locations may facilitate effective rework of the NVRAMS.

Figure 3:
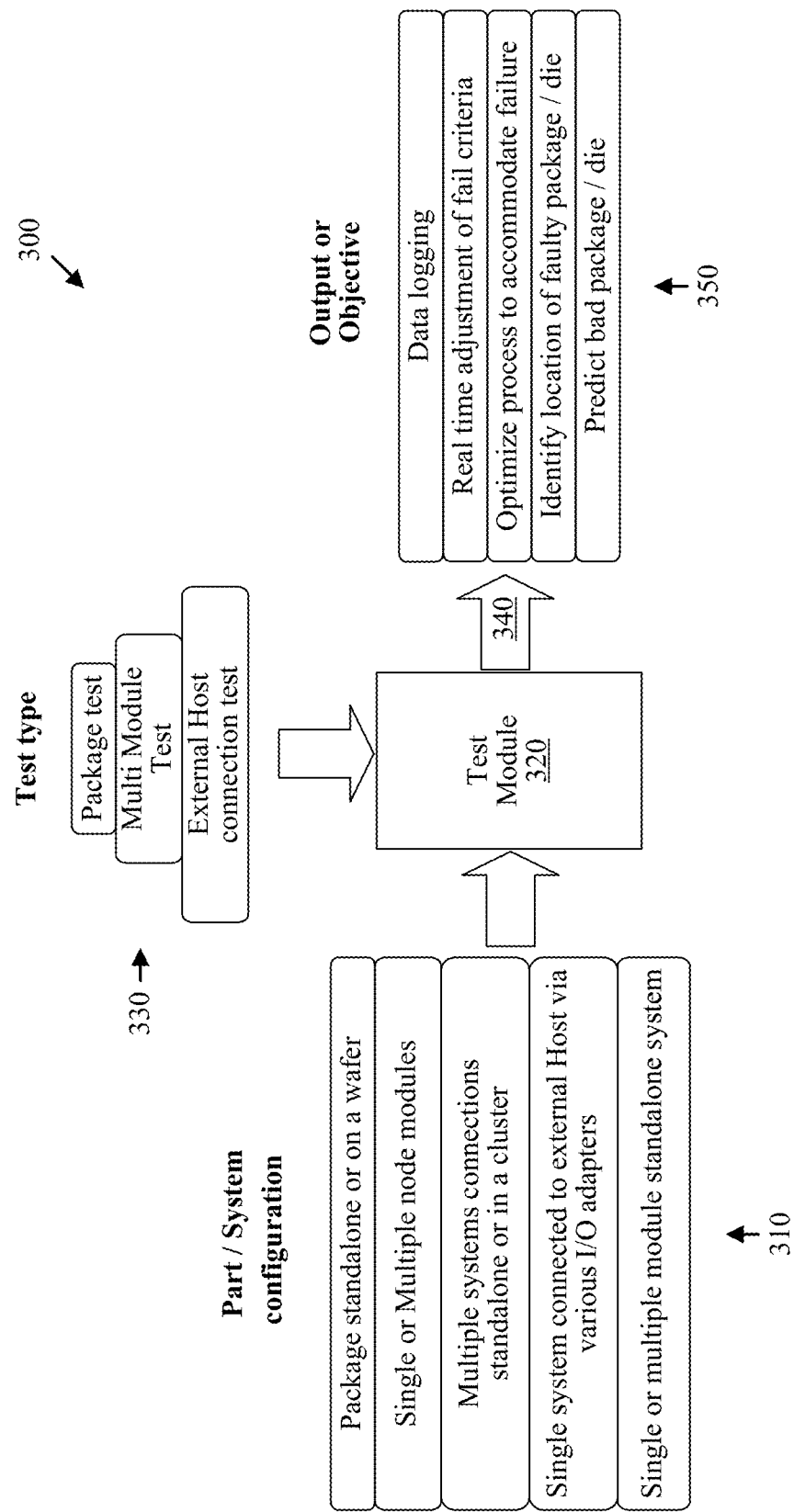
FIG. 3 is a workflow diagram depicting one example of a NVRAM testing environment in accordance with at least one embodiment of the present invention.

FIG. 3 is a workflow diagram depicting one example of a NVRAM testing environment in accordance with at least one embodiment of the present invention. As depicted, various forms of NVRAMS 310 may be tested by a testing module 320 as directed by one or more test programs 330. The NVRAMS 310 may be tested previous to, or after, packaging and integration. Examples of the NVRAMS 310 include die, chips, wafers, modules, cards, and racks.

The test module 320 under direction of the test programs 330 may collect data 340 that is used for various purposes 350 including failure prediction, dynamic adjustment of separation metrics and thresholds, process optimization, identification of fault locations and the like.

Figure 4:
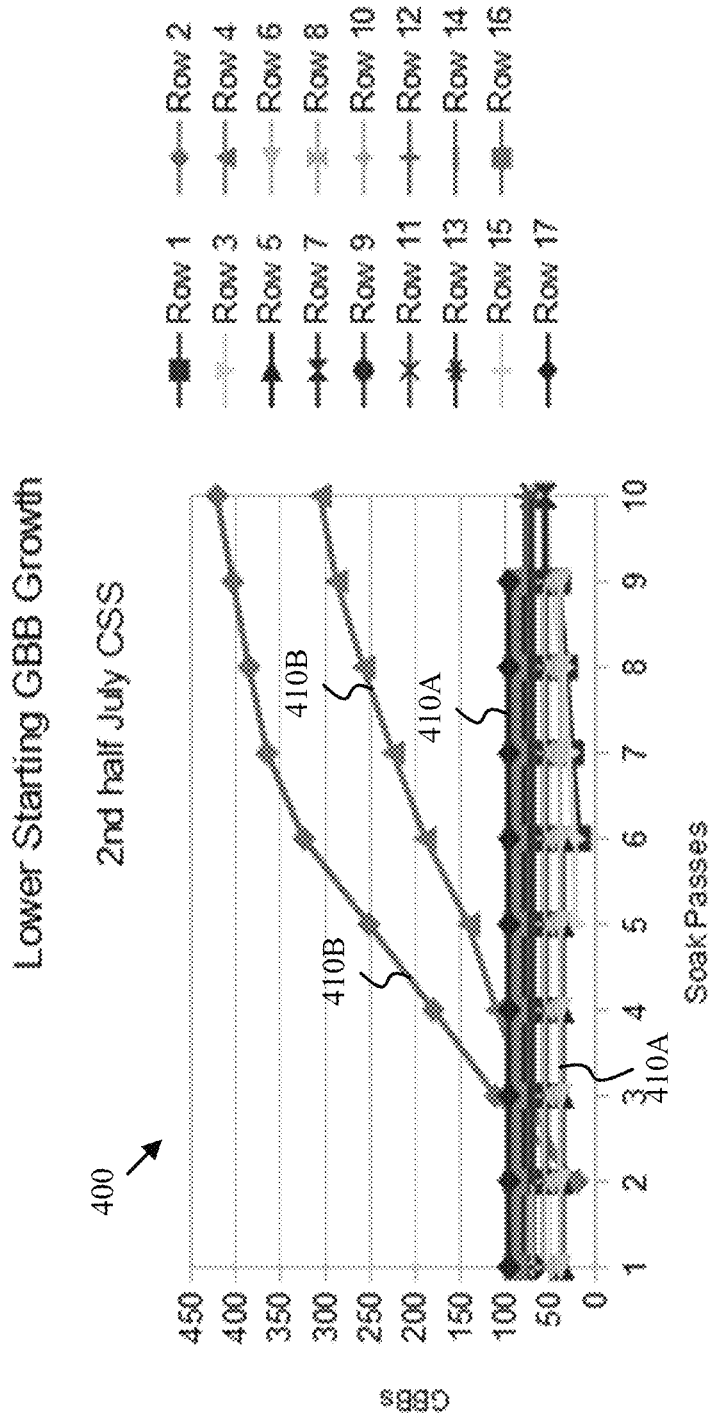
FIG. 4 is a graph depicting one example of failure metric data in accordance with at least one embodiment of the present invention.

FIG. 4 is a graph depicting one example of failure metric data 400 in accordance with at least one embodiment of the present invention. As depicted, the failure metric data 400 includes various failure metric patterns 410 including acceptable patterns 410A and unacceptable patterns 410B.

While conventional testing typically sorts NVRAMS based on an average value of the failure metric for a specific number of testing cycles, the embodiments herein enable the detection of trends in the failure metric patterns. Consequently, unacceptable NVRAMS may be detected with a fewer number of testing cycles. For example, the derivative or predicted (i.e., extrapolated) future value of the failure metric for the unacceptable NVRAMS may exceed a selected threshold well before the average value—particularly at a selected level of confidence. Consequently, the unacceptable patterns 410B may be flagged with just a few testing cycles (e.g., 3 or 4 instead of 5 or 6).

Figure 5:
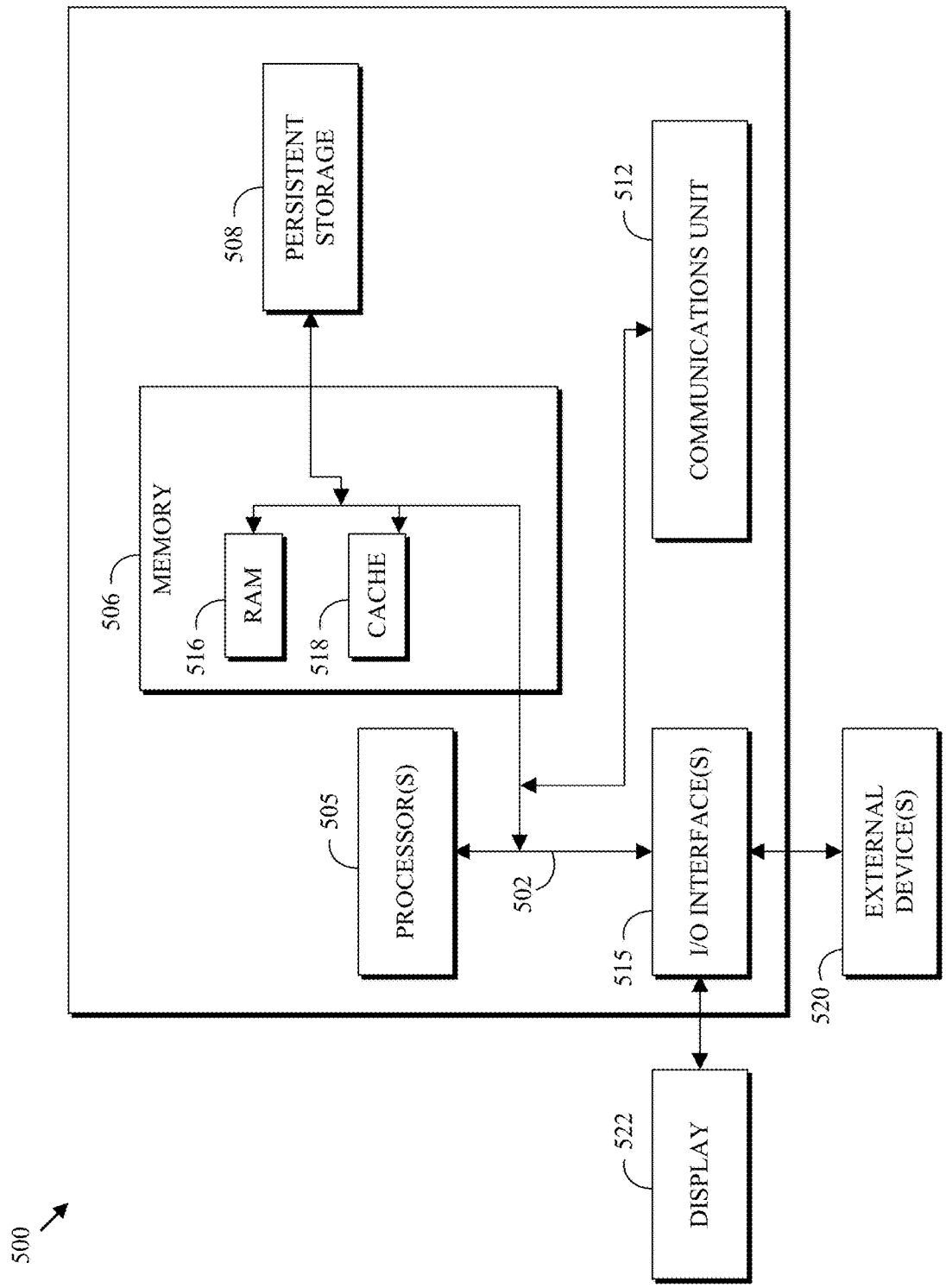
FIG. 5 is a block diagram depicting one example of a computing apparatus (i.e., computer) suitable to, or adaptable to, executing the methods disclosed herein.

FIG. 5 is a block diagram depicting one example of a computing apparatus (i.e., computer 500) suitable to, or adaptable to, executing the methods disclosed herein. It should be appreciated that FIG. 5 provides only an illustration of one embodiment and does not imply any limitations with regard to the environments in which different embodiments may be implemented. Many modifications to the depicted environment may be made.

As depicted, the computer 500 includes communications fabric 502, which provides communications between computer processor(s) 505, memory 506, persistent storage 508, communications unit 512, and input/output (I/O) interface(s) 515. Communications fabric 502 can be implemented with any architecture designed for passing data and/or control information between processors (such as microprocessors, communications and network processors, etc.), system memory, peripheral devices, and any other hardware components within a system. For example, communications fabric 502 can be implemented with one or more buses.

Memory 506 and persistent storage 508 are computer readable storage media. In the depicted embodiment, memory 506 includes random access memory (RAM) 516 and cache memory 518. In general, memory 506 can include any suitable volatile or non-volatile computer readable storage media.

One or more programs may be stored in persistent storage 508 for execution by one or more of the respective computer processors 505 via one or more memories of memory 506. The persistent storage 508 may be a magnetic hard disk drive, a solid state hard drive, a semiconductor storage device, read-only memory (ROM), erasable programmable read-only memory (EPROM), flash memory, or any other computer readable storage media that is capable of storing program instructions or digital information.

The media used by persistent storage 508 may also be removable. For example, a removable hard drive may be used for persistent storage 508. Other examples include optical and magnetic disks, thumb drives, and smart cards that are inserted into a drive for transfer onto another computer readable storage medium that is also part of persistent storage 508.

Communications unit 512, in these examples, provides for communications with other data processing systems or devices. In these examples, communications unit 512 includes one or more network interface cards. Communications unit 512 may provide communications through the use of either or both physical and wireless communications links.

I/O interface(s) 515 allows for input and output of data with other devices that may be connected to computer 500. For example, I/O interface 515 may provide a connection to external devices 520 such as a keyboard, keypad, a touch screen, and/or some other suitable input device. External devices 520 can also include portable computer readable storage media such as, for example, thumb drives, portable optical or magnetic disks, and memory cards.

Software and data used to practice embodiments of the present invention can be stored on such portable computer readable storage media and can be loaded onto persistent storage 508 via I/O interface(s) 515. I/O interface(s) 515 may also connect to a display 522. Display 522 provides a mechanism to display data to a user and may be, for example, a computer monitor.

One of skill in the art will appreciate that the above disclosed embodiments may be adapted for a variety of environments and applications. Furthermore, the programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

The embodiments disclosed herein include a system, a method, and/or a computer program product. The computer program product may include a computer readable storage medium (or media) having computer readable program instructions thereon for causing a processor to carry out the methods disclosed herein.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowcharts and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It should be noted that this description is not intended to limit the invention. On the contrary, the embodiments presented are intended to cover some of the alternatives, modifications, and equivalents, which are included in the spirit and scope of the invention as defined by the appended claims. Further, in the detailed description of the disclosed embodiments, numerous specific details are set forth in order to provide a comprehensive understanding of the claimed invention. However, one skilled in the art would understand that various embodiments may be practiced without such specific details.

Although the features and elements of the embodiments disclosed herein are described in particular combinations, each feature or element can be used alone without the other features and elements of the embodiments or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

What is claimed is:

1. A computer program product comprising:
   one or more non-transitory computer readable storage media; and
   program instructions stored on the one or more non-transitory computer readable storage media, the program instructions comprising instructions executable by a computer to perform:
   testing a failure metric for each of a plurality of NVRAMS over a plurality of testing sessions to capture failure metric data that corresponds to the plurality of NVRAMS,
   determining a trend in the failure metric as a function of testing cycles for each of the plurality of NVRAMS from the failure metric data,
   physically separating the plurality of NVRAMS into routing groups based on the trend in the failure metric as a function of testing cycles, and
   physically routing, via the one or more processors, the routing groups within a manufacturing environment.

2. The computer program product of claim 1, wherein determining the trend in the failure metric comprises determining an extrapolated value for the failure metric.

3. The computer program product of claim 1, wherein determining the trend in the failure metric comprises determining a derivative for the failure metric.

4. The computer program product of claim 1, wherein separating the plurality of NVRAMS into groups based on the trend in the failure metric comprises determining whether the trend in the failure metric for a selected NVRAM deviates significantly from typical trends in the failure metric for the plurality of NVRAMS.

5. The computer program product of claim 1, wherein the program instructions comprise instructions to repetitively conduct testing sessions until a confidence level is attained for one or more separation metrics derived from the failure metric data.

6. The computer program product of claim 1, wherein the program instructions comprise instructions to weight the failure metric according to the testing session.

7. The computer program product of claim 1, wherein the failure metric is selected from the group consisting of a grown bad blocks count, a total bad blocks count, a bit error rate, and an error count.

8. The computer program product of claim 1, wherein groups comprise at least one of a scrap group, a rework group, an acceptable quality group, and an exceptional quality group.

9. The computer program product of claim 1, wherein the failure metric is used to determine a faulty device location.

* * * * *